(12) United States Patent
Land et al.

(10) Patent No.: US 10,698,023 B2
(45) Date of Patent: Jun. 30, 2020

(54) METHOD AND DEVICE FOR BROADBAND ANALYSIS OF SYSTEMS AND SUBSTANCES

(75) Inventors: Raul Land, Tallinn (EE); Paul Annus, Tallinn (EE); Mart Min, Tallinn (EE); Olev Märtens, Tallinn (EE); Jaan Ojarand, Tallinn (EE)

(73) Assignee: Tallinn University of Technology, Tallinn (EE)

(*) Notice: Subject to any disclaimer, the term of this patent is extended or adjusted under 35 U.S.C. 154(b) by 1687 days.

(21) Appl. No.: 13/598,955

(22) Filed: Aug. 30, 2012

(65) Prior Publication Data

US 2013/0054178 A1 Feb. 28, 2013

(30) Foreign Application Priority Data

Aug. 30, 2011 (EE) .................................. 201100054

(51) Int. Cl.
*H03M 1/12* (2006.01)
*G01R 31/28* (2006.01)
(Continued)

(52) U.S. Cl.
CPC ......... *G01R 31/2841* (2013.01); *G01R 27/28* (2013.01); *G06F 1/03* (2013.01)

(58) Field of Classification Search
CPC ............................ G05B 13/048; G05B 13/042
See application file for complete search history.

(56) References Cited

U.S. PATENT DOCUMENTS 3,764,995 A * 10/1973 Helf, Jr. ............ G01R 31/31908
324/73.1
4,067,060 A * 1/1978 Poussart ................ G01R 23/16
324/76.21
(Continued)

FOREIGN PATENT DOCUMENTS

EP 1 786 322 B1 10/2009
WO 2004052198 A1 6/2004
(Continued)

OTHER PUBLICATIONS

Barker et al. "System Identification with multi-level periodic perturbation signals" (1999).*
(Continued)

*Primary Examiner* — Sujoy K Kundu
*Assistant Examiner* — Leonard S Liang
(74) *Attorney, Agent, or Firm* — Maine Cernota & Rardin

(57) ABSTRACT

A method and device for high speed broadband testing of systems and substances using a binary, spectrally sparse sequence (SSS) as a periodic excitation waveform. The sequences with controllable frequency and magnitude spectra content are designed by component manipulation method or by edge manipulation method. The excitation waveform is typically pre-calculated, and kept in waveform memory, from where it is shifted out into digital to physical quantity converter (DQC).

The sparse spectrum of the SSS makes it easy to create plenty of uncorrelated frequency sets with adjacent, but sufficiently different frequencies to form multi-path test systems, where all the paths can be measured simultaneously.

The response of the sample under test (SUT) is sampled and the complex transfer function is calculated directly or indirectly via Impulse Response by Discrete Fourier Transform technique and its derivatives. The sequence bit interval and sampling interval have a predetermined ratio.

16 Claims, 8 Drawing Sheets

(51) Int. Cl.
*G01R 27/28* (2006.01)
*G06F 1/03* (2006.01)

(56) References Cited

U.S. PATENT DOCUMENTS

| | | | | |
|---|---|---|---|---|
| 4,093,988 | A | | 6/1978 | Scott |
| 4,187,466 | A | * | 2/1980 | Kasson ............... H04B 14/046 341/131 |
| 4,539,518 | A | * | 9/1985 | Kitayoshi ............. G01R 23/16 324/76.15 |
| 4,667,296 | A | * | 5/1987 | Crowe ............... G01R 31/2837 341/118 |
| 5,051,916 | A | * | 9/1991 | Benson ................. G01R 23/16 702/76 |
| 6,023,488 | A | * | 2/2000 | White ..................... H04B 1/69 370/342 |
| 6,272,441 | B1 | * | 8/2001 | Peyerl .................... G01R 27/28 324/76.21 |
| 6,570,394 | B1 | * | 5/2003 | Williams ............... H04N 17/00 324/620 |
| 7,194,317 | B2 | * | 3/2007 | Kothare ................. G05B 17/02 700/28 |
| 2004/0034486 | A1 | * | 2/2004 | Iannuzzi ................ G01R 27/28 702/66 |
| 2006/0066289 | A1 | * | 3/2006 | Tanbakuchi ........... G01R 27/28 324/76.19 |
| 2007/0069943 | A1 | * | 3/2007 | Adams .................. G01J 3/4406 342/130 |
| 2007/0185671 | A1 | * | 8/2007 | Barford ............. G01R 31/2841 702/76 |
| 2008/0288184 | A1 | * | 11/2008 | Giurgiutiu ......... G01N 27/9046 702/35 |
| 2014/0029932 | A1 | * | 1/2014 | Randel ............... G01M 11/3118 398/13 |

FOREIGN PATENT DOCUMENTS

| | | | |
|---|---|---|---|
| WO | 2007054700 | A1 | 5/2007 |
| WO | WO-2008125124 | A1 * | 10/2008 ........... A61B 5/7257 |
| WO | 2009138093 | A1 | 11/2009 |

OTHER PUBLICATIONS

Jie ("FPGA-Based Analog Functional Measurements for Adaptive Control in Mixed-Signal Systems"; IEEE Transactions on Industrial Electronics, vol. 54, No. 4, Aug. 2007). (Year: 2007).*

Ojarand et al; "Comparison of Spectrally Sparse Excitation Signals for Fast Bioimpedance Spectroscopy"; 978-1-4673-0882/12/$31.00 © 2012 IEEE. (Year: 2012).*

Manikandan et al; "Detection and Classification of Power Quality Disturbances Using Sparse Signal Decomposition on Hybrid Dictionaries"; IEEE Transactions on Instrumentation and Measurement, vol. 64, No. 1, Jan. 2015. (Year: 2015).*

Roinila, Tomi; Vilkko, Matti; and Suntio, Teuvo—"Fast Loop Gain Measurement of a Switched-Mode Converter Using a Binary Signal With a Specified Fourier Amplitude Spectrum"; IEEE Transactions of Power Electronics, vol. 24, No. 12, Dec. 2009; pp. 2746-2755 (Year: 2009).*

Yang, Yuxiang et al., "Design of a Wideband Excitation Source for Fast Bioimpedance Spectroscopy", Measurement Science Technology, 2011, pp. 1-9, vol. 22.

Schroeder, M.R., "Synthesis of Low-Peak-Factor Signals and Binary Sequences with Low Autocorrelation", IEEE Transactions on Information Theory, Jan. 1970, pp. 85-89.

Schoukens, J. et al., "Survey of Excitation Signals for FFT Based Signal Analyzers", IEEE Transactions on Instrumentation and Measurement, Sep. 1988, pp. 342-343, vol. 37, No. 3.

Rife, Douglas D. and Vanderkooy, John, "Transfer-Function Measurement with Maximum-Length Sequences", J. Audio Eng. Soc., Jun. 1989, pp. 419-444, vol. 37, No. 8.

Pliquett, Uwe, "Bioimpedance: A Review for Food Processing", Food Eng. Rev., 2010, pp. 74-94.

Pintelon, Rik and Schoukens, Johan, "System Identification a Frequency Domain Approach", IEEE Press, 2001, pp. 115-138.

Van Der Ouderaa, Edwin et al., "Peak Factor Minimization of Input and Output Signals of Linear Systems", IEEE Transactions on Instrumentation and Measurement, Jun. 1988, pp. 207-212, vol. 37, No. 2.

Nacke, T. et al., "A New Hard and Software Concept for Impedance Spectroscopy Analysers for Broadband Process Measurements", IFMBE Proceedings, 2007, pp. 194-197, vol. 17.

Min, Mart et al., "Lock-In Measurement of Bio-Impedance Variations", Measurement, 2000, pp. 21-28, vol. 27.

Min, Mart et al., "Comparison of Rectangular Wave Excitations in Broad Band Impedance Spectroscopy for Microfluidic Applications", IFMBE Proceedings, 2009, pp. 85-88, vol. 25.

Kuhlberg, Aivo et al., "PWM Based Lock-In Bioimpedance Measurement Unit for Implantable Medical Devices", Proceedings, Jun. 2003, pp. 1710-1713.

Gawad, Shady et al., "Impedance Spectroscopy Using Maximum Length Sequences: Application to Single Cell Analysis",American Institute of Physics, 2007, 8 pgs.

Boyd, Stephen, "Multitone Signals with Low Crest Factor", IEEE Transactions on Circuits and Systems, Oct. 1986, pp. 1018-1022, vol. CAS-33, No. 10.

Van Den Bos, A., "A New Method for Synthesis of Low-Peak Factor Signals", IEEE Transactions on Acoustics, Speech and Signal Processing, Jan. 1987, pp. 120-122, vol. ASSP-35, No. 1.

* cited by examiner

METHOD AND DEVICE FOR BROADBAND ANALYSIS OF SYSTEMS AND SUBSTANCES

RELATED APPLICATIONS

This application claims priority to Estonian Application No. P201100054, filed Aug. 30, 2011. This application is herein incorporated by reference in its entirety for all purposes.

FIELD OF THE INVENTION

The invention relates to a method and device for signal generation for the broadband high speed measurement of the complex transfer function of the systems and substances.

The invention relates particularly, but not exclusively, to methods and apparatus for measuring the complex transfer function of a Sample Under Test (SUT), such as a device or arrangement of devices, including an electric device, electric network, material or any other sample under test when dry or in a liquid, biological tissues, biological organ or entity, or arrangement thereof, in vitro or in vivo, suspensions, colloids, etc. In this setup a binary, spectrally sparse sequence (SSS), generated from a data in a waveform memory and a zero order hold circuitry (digital to quantity converter, DQC), is applied as a periodic excitation signal for high speed broadband testing SUT and the complex transfer function is determined directly by Discrete Fourier and its derivatives or indirectly via impulse response.

BACKGROUND OF THE INVENTION

A transfer function is a mathematical representation, in terms of spatial or temporal frequency, of the relation between the input and output of linear time-invariant (LTI) systems. Real structures have non-linear input/output characteristics, but many systems, when operated within nominal parameters (not "over-driven") have behaviour that is close enough to linear so that LTI system theory is an acceptable representation of the input/output behaviour.

Frequency response measurements can be used directly to quantify system performance and substance properties. However time variance of real systems should be considered and therefore the frequency response measurement speed chosen accordingly.

Traditionally sine wave excitation is used for the measurement of frequency domain characteristics (frequency response function—FRF) of different objects and substances.

Simultaneous multisine excitation (composed as a sum of several sine wave components) has been introduced for high speed parallel measurements. Because of a high-value crest factor CF (up to 10 and more without special optimization) the multisine excitation causes serious problems. As the peak value is limited in practical applications (e.g., ±1 V or ±1 mA), the root mean square (RMS) level can be very modest and the excitation energy tends to be too low at each individual excitation frequency (spectral line in the excitation spectrum). Several methods for reducing the crest factor have been presented, the simplest of which—randomizing of initial phases of sine wave components—enables to reduce CF to 1.8. A better idea is to find optimal values for the initial phases of separate sine wave components in the multisine excitation. A better optimization method was developed by A. van den Bos (Schroeder, 1.414×1.17=1.65, van den Bos, 1.414×1.07=1.51, see Tabel 1 in p. 122). Those values are only slightly worse than of a single sine wave (CF=1.414), but still far from ideal (for example, a rectangular signal has CF=1). Van der Ouderaa et al. showed that even CF<1.414 is achievable using iterative calculations—they obtained CF=1.405, for a signal with 15 and 31 equal magnitude components. There is no mathematical expression or ideal algorithm for synthesis of the multisine signal with minimal CF (if all the signal components have equal magnitude). The minimal theoretical value of CF is not known, but CF about 1.5 is achievable in practice. To conclude, a carefully designed multisine signal with optimized CF is the best excitation for fast broadband measurements.

In practice, however, rectangular wave excitations have been introduced as they can be generate by the aid of conventional digital components like triggers, logic gates, and shift registers or computing devices like microcontrollers and signal processors. Moreover, the rectangular waveform can provide more excitation energy compared to sine wave at the same limitations to the peak value (amplitude). For example, the power of a single sine wave is $P=A^2/2$ and its root-mean-square value $RMS=A/2^{1/2}$, where A is the sine wave amplitude. At the same peak value A, the power of a simple rectangular signal is $P=A^2$, and its $RMS=A$. unfortunately, rectangular signals contain higher harmonics, which complicate measurement procedures and cause serious measurement uncertainties. Several solutions to suppress the role of higher harmonics of rectangular excitations are proposed for the replacement of single sine wave excitations.

To cover a wide frequency band, pseudorandom rectangular waveforms as maximum length sequences (MLS), and rectangular chirp signals are in use. Such signals have one serious disadvantage—their energy is distributed almost equally over the whole frequency band of interest. Therefore, the power spectral density $A^2/Hz$ is comparatively low at all the frequencies within the measurement bandwidth. In practice, however, only in some special cases there is a need to measure at all frequencies within the measurement bandwidth, often measuring at 2-3 or up to 100 distinct frequencies is satisfactory. Therefore, it is reasonable to concentrate the energy of excitation signals to certain specific frequencies instead of using uniform energy distribution over all measurement bandwidth. Such the signals are known as multifrequency binary signals. There is mentioned also that such the signals have a severe drawback—the energy is not solely located at the specific frequencies, but is spread also over a great number of undesired, "parasitic", frequencies.

U.S. Pat. No. 4,093,988 describes a measurement method, in which a pseudo-random maximum length sequence (MLS) of rectangular pulses with equal peak values is used for excitation of the samples under test (electrical or mechanical system). A binary shift register with feedback generates the MLS signal. The response signal is processed with Fast Fourier Transform program running in a computing device. Besides the above described drawback that energy distributes continuously over the full measurement bandwidth, the MLS excitation has two additional disadvantages: 1) the useful excitation bandwidth extends only up to $0.45f$ of the whole frequency band $f$ with degradation to 50% in power spectral density at $0.45f$, and, 2) significant amount of generated energy (near to 40%) falls onto higher frequencies outside the measurement bandwidth $0.45f$.

Despite of above described disadvantages, MLS excitation has found an intensive use in audio engineering and electro-acoustic. The MLS excitation is used even more widely, e.g., in impedance spectroscopy.

WO2007/054700 proposes a new type of MLS excitation, where certain higher amplitude rectangular pulses are formed to emphasize the excitation energy within some specific frequency sub-range. A special unit for compensation of transfer function is introduced for that purpose. The proposed solution indeed enables to overcome the main disadvantage of MLS excitation—distribution of excitation energy continuously over all the frequencies of measurement bandwidth—and to enhance the dynamic range of the measurement device in this way. But this invention abandons the ultimate advantage of rectangular waveforms—their minimal crest factor (CF=1). The crest factor CF=A/RMS of the MLS signals by this solution exceeds significantly the unity value, which is the unique property of the sequence of rectangular pulses with equal amplitude.

An alternative to MLS signal is application of rectangular chirp excitation. Rectangular chirp has better energy parameters than MLS, because there is no degradation of the power spectral density within the measurement bandwidth. Moreover, about 90% of the generated energy becomes useful, only 10% of generated energy falls outside the measurement bandwidth and turns useless. But the main disadvantage remains—the energy of excitation is distributed equally over the full measurement bandwidth.

A method for maximizing the overall dynamic range via synthesizing the excitation waveform on the bases of pre-estimation of the frequency response function is described in U.S. Pat. No. 7,194,317. The algorithm of synthesis is based on iterative direct and inverse Fourier transforms of the randomized excitation signal and estimated frequency response function together with their mutual comparison and correction of the excitation signal.

The algorithm is expected to generate the pseudorandom excitation with continuous spectral density. By its essence, the algorithm described in U.S. Pat. No. 7,194,317 is very similar to that method.

A number of attempts are made to adjust the frequency and amplitude properties according to the characteristics of the SUT in order to maximize the overall dynamic range of the calculations by balancing the requirements for the dynamic ranges between the input and output of the SUT.

In one approach the magnitude spectrum is shaped, but the level of the resulting MLS signal is not kept within two discrete levels (+1 and −1).

In another approach the multi-frequency mixed signal in synthesized based on simple superposition of Walsh functions. Resulting binary signal conceals seven primary harmonics (1, 2, 4, 8, 16, 32, and 64) but their amplitudes vary within +/−10%, and are not controllable.

U.S. Pat. No. 7,194,317 describes identification of the systems, where it is desirable to find signals and techniques, which minimize the time spent in data collection. When identifying a multi-input multi-output system, it is also desirable to obtain several statistically uncorrelated signals, thereby making easier to separate out the various input/output relationships of the system, which are measured simultaneously.

The solution suggested here is to delay the original binary multifrequency signal by time, which is long enough that system responses have substantially settled within one effective settling time scale before the cross correlation between any of the signals becomes significant. Therefore these signals are called as nearly stochastically uncorrelated signals.

As the time scale used is one effective settling time, solutions for creating uncorrelated signals are not applicable for experiments, where continuous observation or measurement of the SUT is required.

In general, a limited number of frequencies are needed in order to characterize the SUT in the frequency domain. For example, in majority of practical cases about 2 to 10 frequencies per decade over the whole frequency range of interest describe accurately enough the spectrum of the relatively flat (few dispersions and non resonant behaviour) spectrum. This means, that the spectrally dense MLS and other "white-noise-like" signals are not effective signals to characterize the SUT in frequency domain (transfer function), because as the total energy of the excitation signal is distributed equally over the frequency range, the magnitude of each individual frequency component is low and therefore the initial SNR of the measurements is already low. Therefore it is reasonable to concentrate the available energy within the excitation signal into few limited spectral lines.

For example, the biological samples have quite flat spectrum over the wide frequency range; hence a relatively wide frequency range should be covered by the single multi-frequency excitation signal. This places some strict requirements on the signals, because remarkably different frequencies should be combined into one multi-frequency signal. This results with the signal, consisting of large number of samples, difficult to generate, store and, in particular, to analyze (the calculation time of the DFT increases). Conventionally this is solved by using Short Time Fourier Transform, STFT technique.

The above described methods and algorithms are not applicable for the synthesis of the binary sequence containing predetermined distinct spectral lines which amplitudes are easily controllable (amplitude spectrum shaping) optimizing the overall signal-to-noise ratio (SNR) of the experiments. Additionally, the difficulties to form freely the required frequency content complicate to build test setups for simultaneous, multi-path experiments (orthogonality requirement).

This has great importance in technical fields, where strong limitations to the level of the excitation signals are established in order to prevent extensive influence to the parameters and behaviour of the samples under test (SUT).

SUMMARY OF THE INVENTION

One embodiment of the present invention provides a method and corresponding device for excitation signal construction comprising introduction a template waveform in frequency domain, comparing it against the reference waveform, extracting specific time instances in time domain, optimizing or shaping the magnitude spectrum, and forming the binary sparse spectrum sequence (SSS).

One embodiment of the present invention provides a method and corresponding device for complex transfer function measurements comprising introducing said binary SSS into a SUT, receiving a response signal from said SUT, introducing said response signal into a quantity to digital converter (QDC), introducing said digital signal into a data processing unit to extract the complex transfer function.

One embodiment of the present invention provides a method to create a set of uncorrelated SSS signals with adjacent, but sufficiently different frequency content to form multi-path test systems, where all the paths can be measured simultaneously.

The features and advantages described herein are not all-inclusive and, in particular, many additional features and advantages will be apparent to one of ordinary skill in the art in view of the drawings, specification, and claims. Moreover, it should be noted that the language used in the

BRIEF DESCRIPTION OF THE DRAWINGS

FIG. 5 is an exemplary waveform diagram and a corresponding spectrum of the MLS signal when the spectra are calculated from the complete signal, where

FIG. 6 is an exemplary waveform diagram and a corresponding spectrum of the SSS, when the spectra are calculated from the complete signal, where

FIG. 7 is an exemplary waveform diagram and a corresponding spectrum of the MLS signal and the SSS, when the spectra are calculated from the decimated and averaged waveform.

FIG. 8 depicts the exemplary spectra of the SSS, (p=200000, decimation=100, averaging: ON), when the spectra are calculated from the split data record

FIG. 9 is an exemplary shaped spectra diagrams and corresponding shaping quality diagrams of the created excitation waveform SSS (p=20000) which contains also unusable pseudorandom components (fine gray lines) in addition to the desired components (solid squared lines);

FIG. 10 is an exemplary spectra diagrams of the two similar SSS waveforms (p=20000) with slightly different frequency content;

DETAILED DESCRIPTION

The aim of the invention is to synthesize and generate such a sequence of rectangular binary pulses, which energy is concentrated onto distinctly separate frequencies of interest. Energy level of different frequency components can be varied according to the requirements established by the SUT. As a result, the excitation signal obtains a comb like form with user defined frequencies in frequency domain, but maintains all the advantageous of rectangular waveforms in the time domain: the crest factor of binary sequence sustains the unity value, CF=1. As a result, much higher dynamic range and signal-to-noise ratio is achieved without discarding the ultimate advantage of binary sequence.

Embodiments of the present invention relate to the acquisition of the transfer function in case of systems and substances in comparably short time. The method is faster than traditionally used sweep frequency techniques, as the excitation signal stimulates the SUT simultaneously over the complete broadband spectrum of interest.

The method is more sensitive and accurate than traditionally used broadband techniques which are based on wideband multi-frequency signals, like pseudo-random binary sequence or maximum length sequence (MLS), chirp, number of "white-noise-like" signals, like periodic random noise, Gaussian noise, uniform noise, and different variations of colored noise for special occasions.

Figure 1:
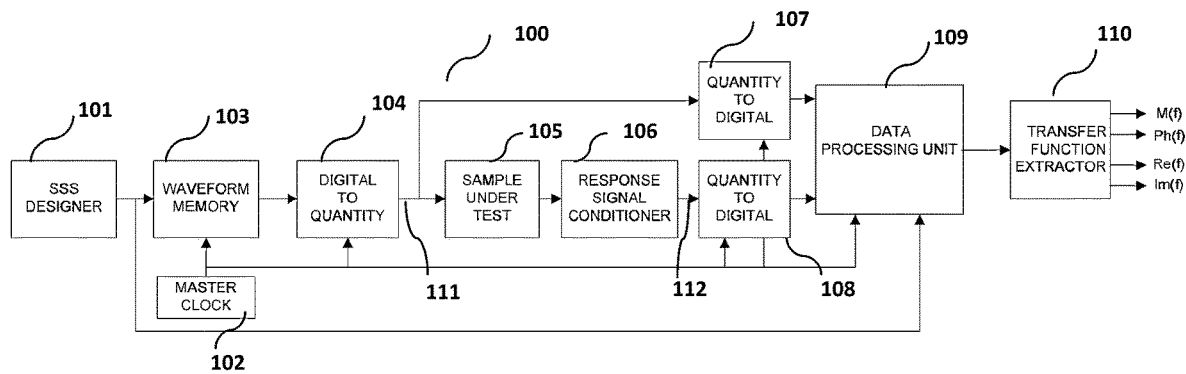
FIG. 1 depicts a schematic diagram according to an embodiment of the present invention.

FIG. 1 depicts a schematic diagram according to one embodiment of the invention. A device or system 100 for measuring the parameters of a SUT 105 comprises a SSS designer 101 for designing a binary SSS, a waveform memory 103 for storing the SSS, a digital to quantity converter (DQC) 104 for converting the SSS into a physical quantity (such as voltage, current, or combination of them, but also pressure, tension, force, temperature, etc) as an excitation signal 111 applied to the SUT 105. Instead of the DQC, its equivalents or other means for providing the excitation signal 111 can be used, e.g. a digital-to-analog converter. The device further comprises a response signal conditioner 106 for preliminary conditioning (i.e., analog filtering and preamplification) of the response signal received from the SUT, a first quantity to digital converter (QDC) 107 for digitizing the excitation signal 111 and a second quantity to digital converter (QDC) 108 for digitizing a conditioned response signal 112. The first QDC 107 is not required if the parameters and values of the excitation signal are known or measured and stored in advance with the required quality.

A data processing unit 109 is adapted to process the response and excitation signal with a Discrete Fourier Transform (DFT), Fast Fourier Transform (FFT) or equivalent technique (direct calculation of the complex transfer function of the SUT), or with a Hadamard Transform technique (indirect calculation of the complex transfer function via the Impulse Response). The final transfer function is extracted from the output results of the data processing unit 109 by the transfer function extractor 110.

A master clock 102 ensures proper synchronization between the waveform memory 103, the digital to quantity converter 104, the quantity to digital converters 107 and 108, and the data processing unit 109 and avoids possible artefacts during data processing phase.

The device is operated as follows. A binary SSS is generated in the SSS designer 101 and stored into the waveform memory 103. Next, the SSS is converted into the excitation signal 111 by the digital to quantity converter (DQC) 104 or equivalent or other means for outputting the sequence in analog or digital format, and applied to the SUT 105. Both the excitation signal 111 and the conditioned response signal 112 of the SUT 105 are digitized by the quantity to digital converters (QDC) 107 and 108 respectively and processed with a Discrete Fourier Transform (DFT) or equivalent in the data processing unit 109 to perform a direct calculation of the complex transfer function in the transfer function extractor 110 of the SUT, or processing the output of the QDC with a Hadamard Transform to compute the impulse response of the SUT, followed by a DFT to compute a transfer function of a SUT.

Figure 2:
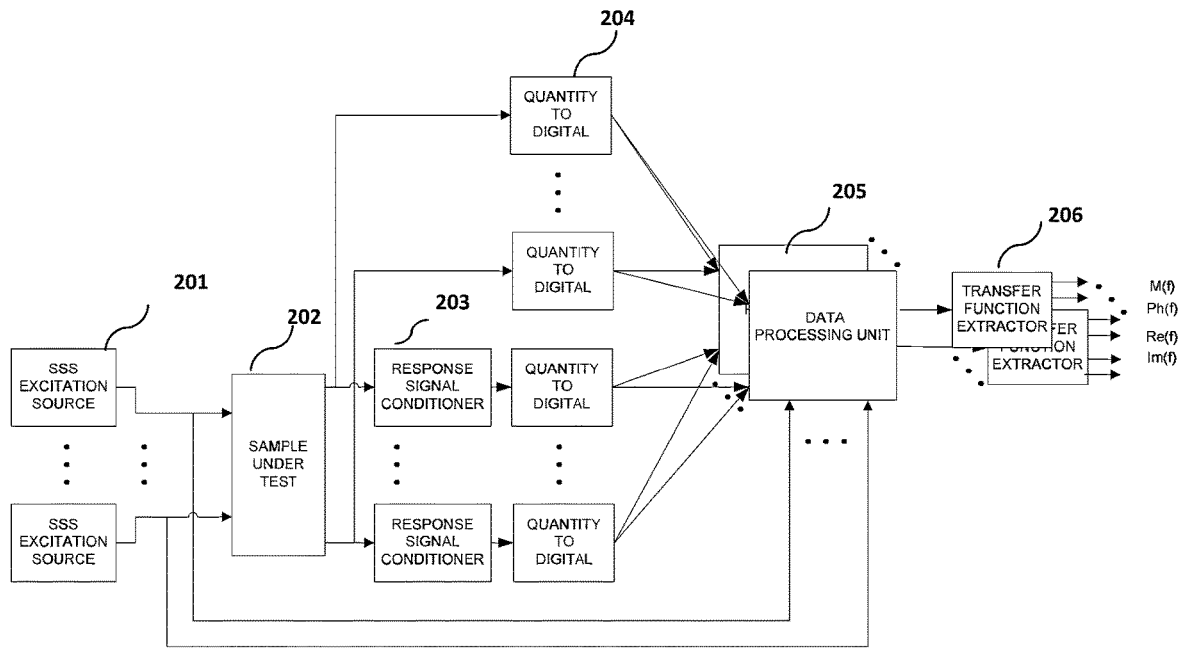
FIG. 2 depicts a schematic diagram according to an embodiment for performing multichannel analysis of systems and substances, comprising two or more measurement channels, stimulated by sequences with different spectra.

FIG. 2 depicts another embodiment of the invention, adapted for simultaneous multi-point measurement (two or more physically dislocated excitation points, and two or more physically dislocated measurement points) of the SUT 202 parameters. As this method is an extension of device depicted in FIG. 1, for simplicity of explanation the SSS designer 101, waveform memory 103, and DQC 104 are shown as an SSS excitation source 201. The device comprises at least two SSS excitation sources 201. Similarly to the device of FIG. 1, the device comprises at least two response signal conditioners 203, quantity to digital converters (QDC) 204, at least two data processing units 205 and transfer function extractors 206, so that at least two complex transfer functions can be calculated.

The device is used similarly to the device FIG. 1. Multiple response signals from the multi-point excited SUT 202 are conditioned in the response signal conditioners 203, digitized in the QDCs 204, and fed to the data processing units 205, where multiple excitation and response signals are processed with a Discrete Fourier Transform (DFT) or equivalent to perform a direct calculation of the complex transfer function of the SUT, or processing the signals with a Hadamard Transform to compute the impulse response of the SUT, followed by a DFT to compute a transfer function of a SUT.

As the spectrum on the excitation sequence SSS is designed to be sparse (see FIG. 10), all SSS excitation sources 201 have individual unique frequency content (i.e. there is no coinciding frequency components within given set of said SSS spectra). This unique feature of SSS concept allows simultaneous broadband measurement of complex transfer functions between all possible combinations of excitation and measurement points.

Figure 3:
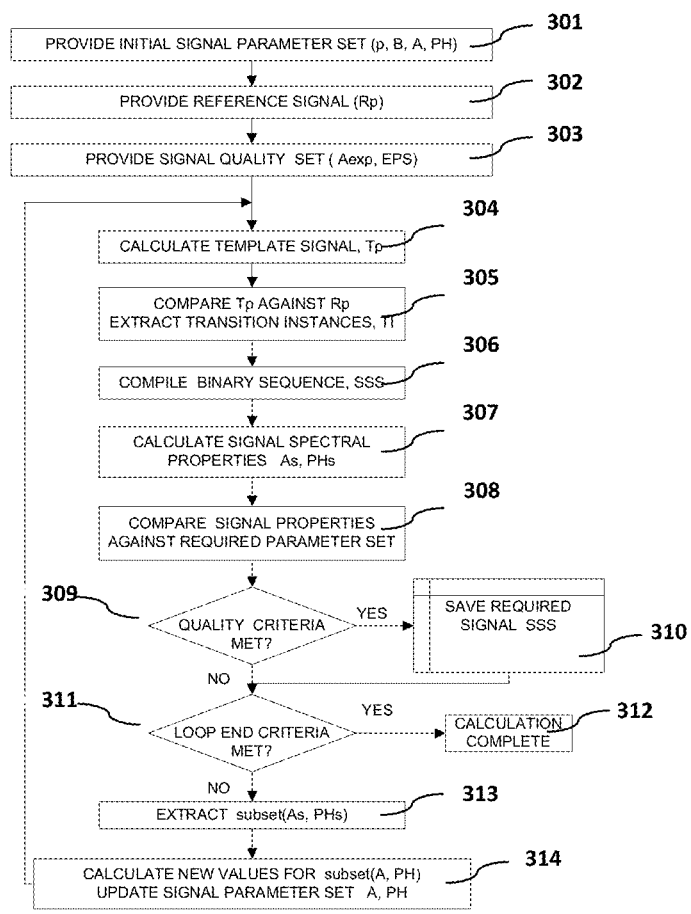
FIG. 3 depicts a component manipulation algorithm for designing of the SSS waveform.

The design process of the SSS excitation signal (binary sequence) can be performed in two major ways: component manipulation method and edge manipulation method.
Component Manipulation Method FIG. 3 is a flowchart of an exemplary embodiment of the component manipulation method for creating the SSS signal. In step 301, several initial parameters (p—signal length, number of points; B—set of required frequency grid, which are bin numbers according to the DFT standards; A—set of corresponding relative amplitudes; PH—set of corresponding initial phase shift) to create the SSS signal are provided. These parameters are determined according to the requirements derived from the actual measurement task.

The frequency content B of the template waveform is defined in frequency domain. For example, 2 to 10 arbitrarily (typically, logarithmically) spaced frequencies per frequency decade (see FIG. 6. $b$) are chosen to form required spectrum of the template waveform.

The element values in the set A may be equal (if SSS signal with flat magnitude spectrum is required) or shaped by some curve, if the manipulated magnitude spectrum in required. For example, in order to increase SNR of the measurements, the excitation signal with pre-emphasized magnitude spectrum can be used (see FIGS. 9 $a$ and $c$). The element values in the set PH are usually randomized within range $[-\pi \ldots +\pi]$ in order to avoid large peak values, when number of sine waves are summed up.

In step 302 a reference waveform Rp is defined. Said reference waveform is used to define the transition instances between two discrete values (+level and −level) of the designed sequence. Parameters of the said reference waveform, such as frequency and amplitude, are chosen to optimize the required frequency content of the final signal. Typical examples of the reference waveform include, but are not limited to simple sinusoid, ramp, triangle and some arbitrary reference levels, including single level, including zero level.

In step 303 the signal quality set (Aexp, EPS) is determined, where Aexp is the expected amplitude spectrum of the binary sequence, and EPS describes the accepted inaccuracies of the created binary sequence amplitude spectrum As (i.e. the corridor (weighted or constant) into which the discrepancies of the actual relative amplitudes set should fit).

Iteration algorithm begins with the step 304, where the template waveform Tp as a sum of sine waves according to the initial parameter set (provided in step 301) is calculated by adding up individual sine components at chosen frequencies in point-by-point approach or by the Inverse Fourier Transform technique or equivalent.

In step 305 the template waveform Tp is compared against the reference waveform Rp. Time instances, where signals Tp and Rp are equal or crossing each other, define the positions of transitions TI and are extracted for later use.

In the compiling procedure 306 the signal level is switched from +level to −level or vice versa according to the extracted TI values, thereby forming a binary sequence SSS. The amplitude As and phase PHs spectrum of the created binary sequence SSS is calculated in 307. In step 308 the calculated signal parameter As is compared against the required quality set (Aexp, EPS) (provided initially in step 303). If the quality criteria are met (step 309), then the actual binary sequence is stored (step 310). Next, in step 311 it is checked if the loop end criteria are met. If not, a subset(As, PHs) from the amplitude spectrum As and phase spectrum PHs is extracted (step 313). This subset is consisting from one or more pair of amplitude and phase values which are extracted according to the pre-estimated criteria, assuring that the iteration process is converging. In step 314, based on the extracted subset values subset(As, PHs) the new values of the corresponding subset subset(A, PH) are calculated according to the pre-estimated formula and the complete parameter set (p, B, A, PH) is updated and the iteration loop will repeated from the step 304, where the new template signal Tp according to the slightly modified parameter set (p, B, A, PH) is calculated. Calculation is completed 312 if the loop end criteria are met. Usually, tens to hundreds iterations are required to calculate the sequence satisfying the quality criteria.

The sequence, in binary form, designed in software, is stored in the waveform memory (typically, simple shift register is sufficient) and then converted for example to a physical quantity, e.g., voltage or current sequence of fixed amplitude and timing using a DQC or equivalent. In practice, in order to avoid the DC component of the excitation signal, the 1 and 0 logical states are often mapped into a negative level and positive level, respectively, to produce a sequence for which the net sum is close to zero.

In simplest case the discussed waveform is achieved when comparing the template waveform against reference DC level, typically zero.

Adding one more level to the output excitation signal, and consequently comparing against two DC values can, to certain extent, clean up the excitation signal from unwanted components between the required spectral lines compared to single bit conversion, with the small penalty in crest factor and maximum level of spectral components.

Comparison with suitable AC waveform can be used to optimize the SSS excitation.

Generally any PWM like technique could be used for the generation of the 1 bit output signal.

Edge Manipulation Method

Figure 6A:
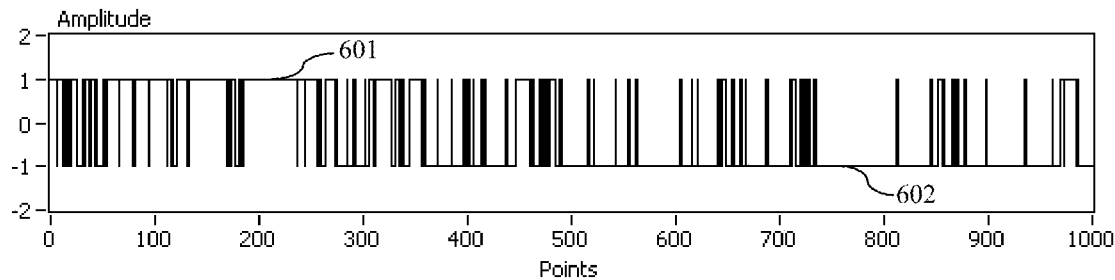
FIG. 6a depicts a SSS waveform (p=262143), only 1000 points slice are drawn for clarity
Figure 6B:
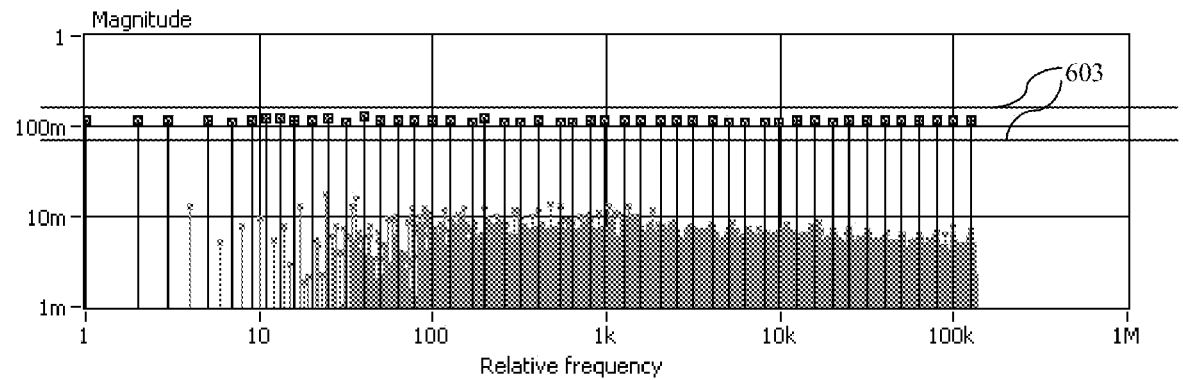
FIG. 6b depicts a SSS spectrum (p=262143).

In edge manipulation method the edge locations or transition instances (time instant, where the signal level is switched from +level 601 to −level 602 or vice versa, see FIG. 6.a) of the binary waveform are manipulated directly in the time domain.

Figure 4:
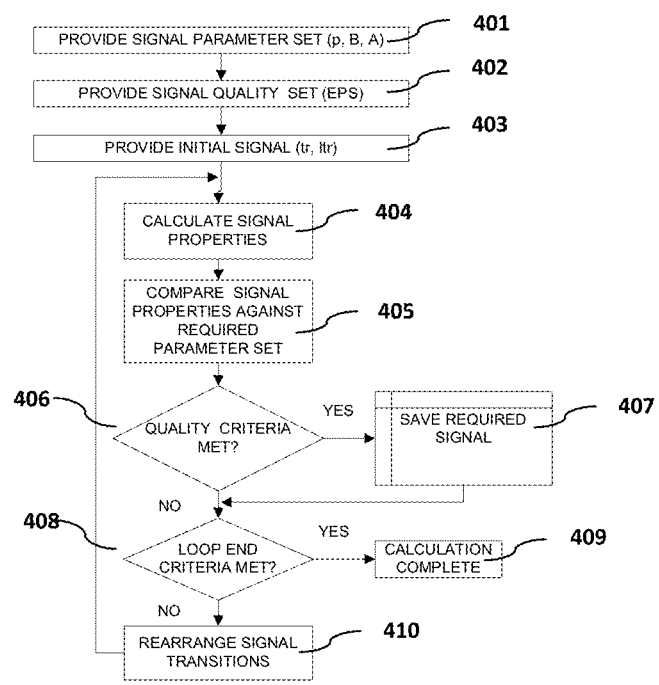
FIG. 4 depicts an edge manipulation algorithm for designing of the SSS waveform.

FIG. 4 is a flowchart of an exemplary edge manipulation method to create a SSS signal. In step 401 several initial parameters (p—signal length, number of points; B—set of required frequency grid, which are bin numbers according to the DFT standards; A—set of corresponding relative amplitudes) to create the SSS signal are provided. These parameters are determined based on the test requirements. The element values in the set A may be constant (if the SSS signal with flat magnitude spectrum is required) or shaped by some curve, if the manipulated magnitude spectrum in required.

In step 402 the acceptance level EPS of the inaccuracy of the created signal spectrum (i.e. the corridor 603, 901 into which the discrepancies of the actual relative amplitudes set should fit) is determined.

According to chosen signal parameters set (step 401) the initial signal is provided in step 403 based on initial parameters: tr—total number of signal transitions, ltr—the maximum length of the signal slice where no transitions occur. As a practical matter, if p is given, tr is 10 to 100 times smaller than p and ltr is at least 100 times smaller than p.

Looping algorithm begins with step 404, where the spectral properties of the initial signal are calculated. In next step 405 these parameters are compared against the required parameter set. If the parameter set quality criteria are met (step 406), then the actual signal is stored (step 407). If additional suitable signals are needed (e.g., for multipath measurements according to FIG. 2) (step 408), then the one or more edges are rearranged (step 410) and looping algorithm is repeated from the step 404. If no additional signals are needed or all the possible edge arrangements are analyzed, the calculations are completed (step 409).

As theoretically, within the given sequence length p, frequency content B and corresponding amplitudes A, the manipulation of edges results with all possible combinations of frequency and magnitude values, it is just the definition of the "end criteria" to select the appropriate sequence for particular test need. Compared to the "continuous" mode, here the frequency and amplitude control stages are inherently concurrent.

Importantly, not only the sequence with flat magnitude spectrum, but practically arbitrary magnitude spectrum can be obtained (of course within limits of the given sequence length p and frequency content B).

The discussed SSS excitation signal has noise like spectral content between the spectral lines of interest. In rare cases it could have impact on object under investigation, or interfere with other measurement channels. It will also imply careful considerations during processing of the response signal from the environment under investigation. Nevertheless it compares very favourably against apparently similar excitation waveforms, such as MLS or square wave chirp signals. Requirements for digital and analog circuitry are considerably relaxed compared with true multisinusoidal excitation and due to higher amplitude of each individual spectral line (when comparing signals within same supply limits) the SNR of the measurements is accordingly higher.

Processing the Response Signal

The response from the sample under test SUT is digitized using a QDC on the same board. Both DQC and QDC tasks are started simultaneously with a synchronous clock for the conversions (see FIG. 1).

Figure 7A:
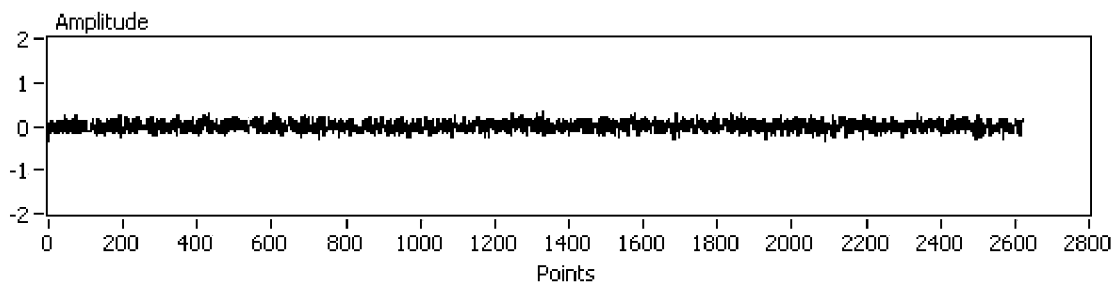
FIG. 7a depicts a waveform of the decimated and averaged MLS signal (N=18, p=$2^N$−1=262143, decimation=100, averaging: ON)
Figure 7B:
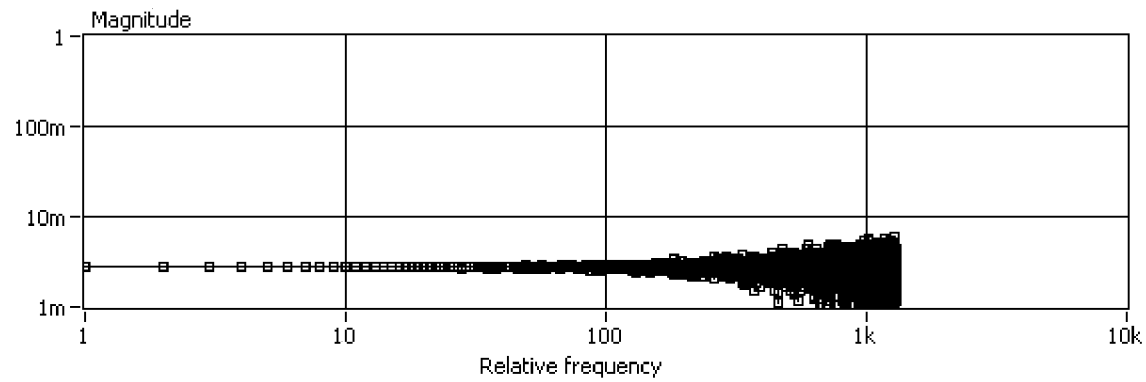
FIG. 7b depicts s a spectrum of the decimated and averaged MLS signal (N=18, p=$2^N$−1=262143, decimation=100, averaging: ON, 2621-point DFT)
Figure 7C:
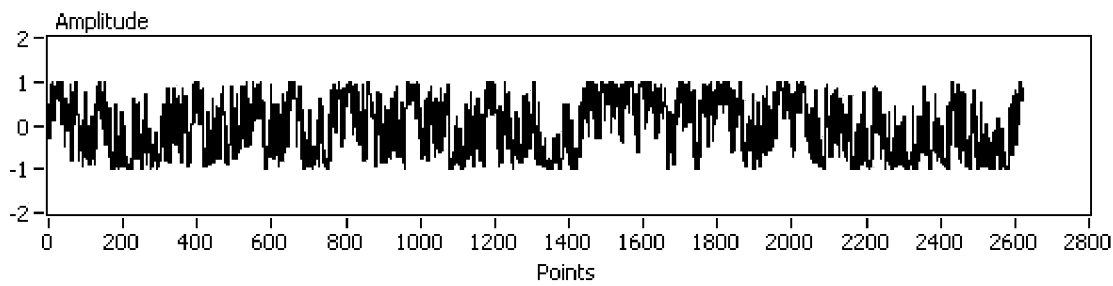
FIG. 7c depicts a waveform of the decimated and averaged SSS signal (p=262143, decimation=100, averaging: ON)
Figure 7D:
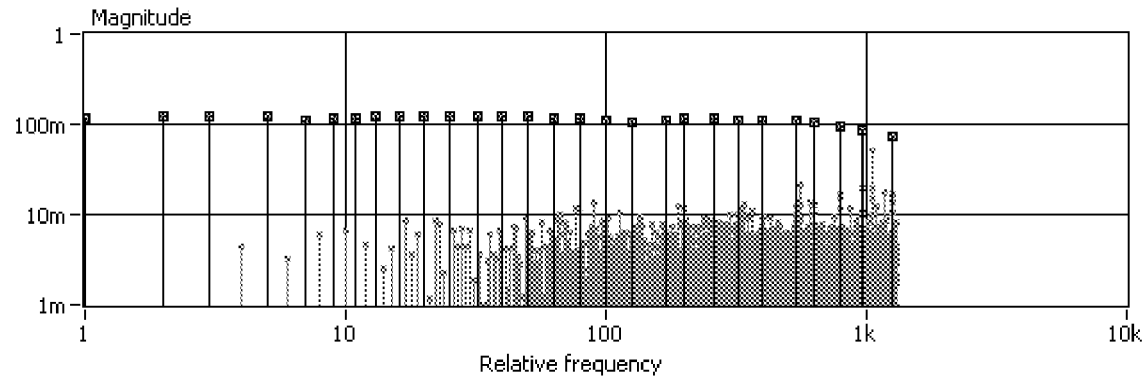
FIG. 7d depicts a spectrum of the decimated and averaged MLS signal (p=262143, decimation=100, averaging: ON, 2621-point DFT).
Figure 8A:
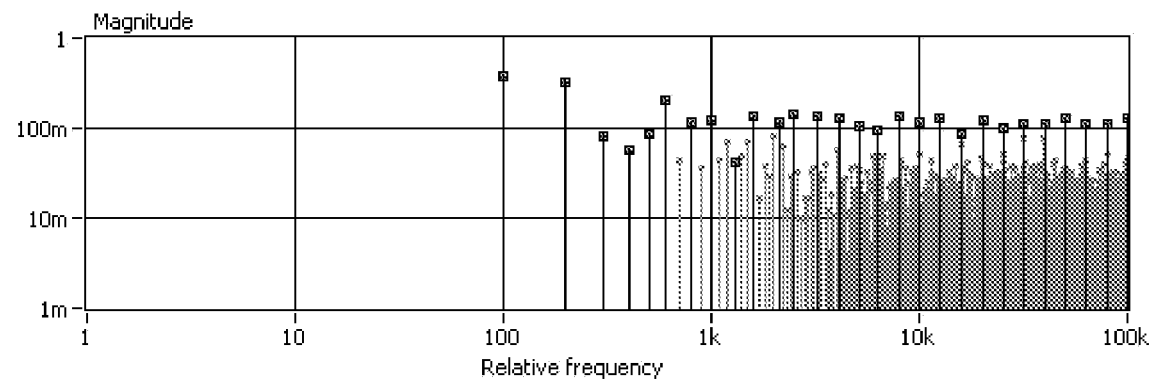
FIG. 8a depicts a spectra of the first split data record, 2000-point DFT from first slice is calculated continuously, when the next 2000 points becomes available from the digitizer.
Figure 8B:
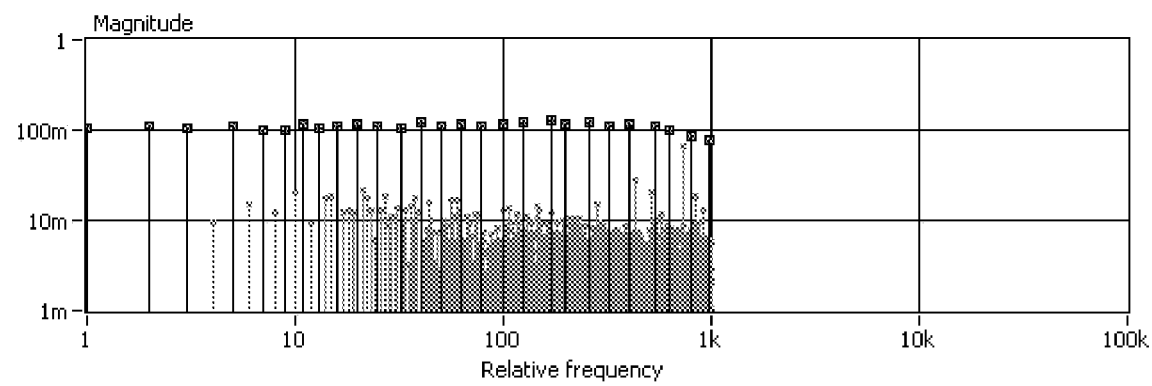
FIG. 8b depicts a spectrum of the decimated and averaged MLS signal; 2000-point DFT).
Figure 9A:
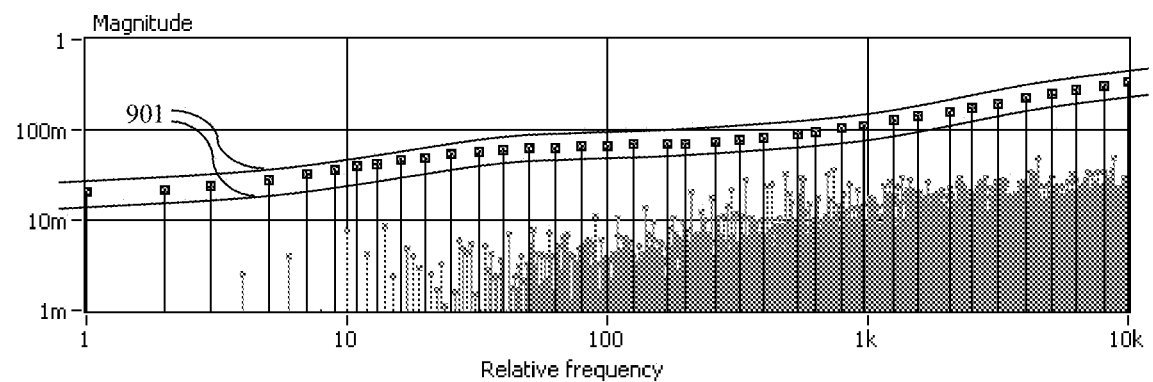
FIG. 9a depicts a shaped spectrum SSS, where lower frequencies (<40 Hz) are de-emphasized and/or higher frequencies (>400 Hz) are emphasized.
Figure 9B:
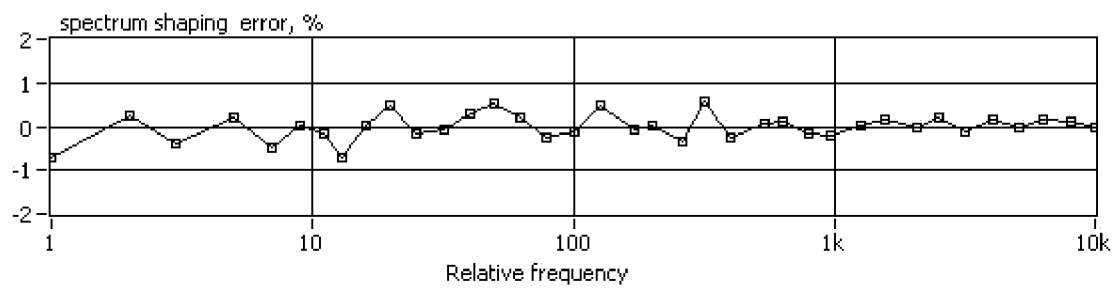
FIG. 9b depicts the corresponding quality curve of spectrum shaping (relative deviations from the desired magnitudes of spectral components)
Figure 9C:
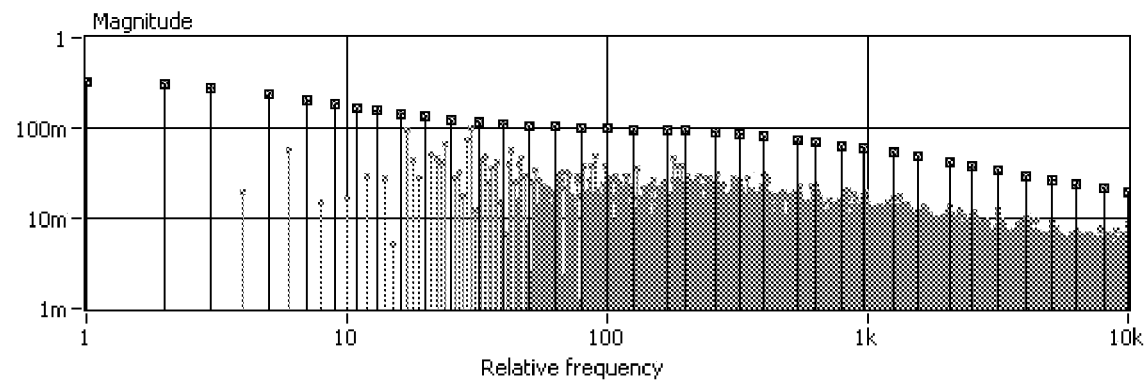
FIG. 9c depicts a shaped spectrum SSS, where lower frequencies (<40 Hz) are emphasized and/or higher frequencies (>400 Hz) are de-emphasized.
Figure 9D:
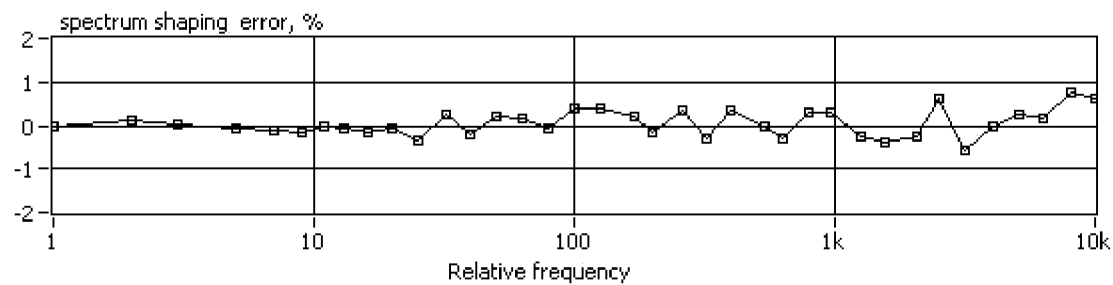
FIG. 9d depicts the corresponding quality curve of spectrum shaping.

Specifically because the desired signals add constructively while the noise and higher frequency components add destructively (see FIGS. 7c and d), it gives an improvement in the SNR. This noise and disturbance reduction technique imply that rapid changes in the system impedance are averaged out, which results in a trade off between noise reduction and the ability to measure dynamic changes in time. This trade off can be avoided by the data record splitting technique (see FIG. 8). The higher frequency components can be extracted continuously when processing the last M samples of the digitized data (see FIG. 8a), the lower frequency components (see FIG. 8b) can be extracted when response to the complete sequence is sampled, decimated and processed. As known in the art, decimation is a two-step process: low-pass anti-aliasing filtering and downsampling.

Let assume that the total length of the data record equals to the length of the excitation sequence, p=200000 points and the sampling rate is 200 kSa/s. Then the total data record is available after 1 second, every next 2000-points slice is available at 10 ms, i.e. the upper range spectrum (from 100 Hz up to 100 kHz) is available at every 10 ms. The lower range spectrum (from 1 Hz to 1 kHz) is available, when the complete excitation sequence is recorded, i.e. after 1 second the data recording was started. As the excitation sequence can be repeated without gap in time, the succeeding lower range spectrum can be obtained at any time, because the power spectrum is invariant to the initial phase of the data record. When measuring simultaneously both, the excitation and response signals, a complex transfer function in full frequency range can be also obtained at any time.

Note that the decimation procedure comprises an averaging operation (which has sinc-filter features), therefore the aliasing components are suppressed by the factor, defined by sinc-filter. As the individual frequencies in the SSS-signal are chosen in a way, that their possible aliasing components do not coincide with the main frequencies, no additional filtering is required. This is clearly illustrated in FIG. 7.d where in the range of 300 Hz to 1 kHz some aliasing components are noticeable, but they are positioned apart from the frequencies of interest.

Figure 5A:
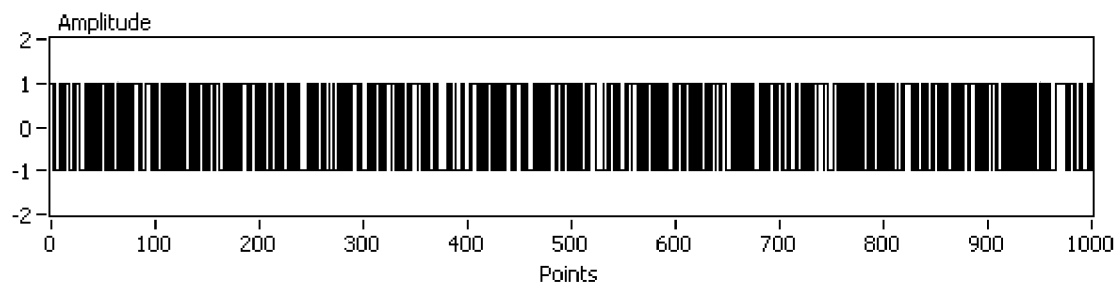
FIG. 5a depicts a MLS waveform (N=18, p=$2^N$−1=262143), only 1000 points slice are drawn for clarity
Figure 5B:
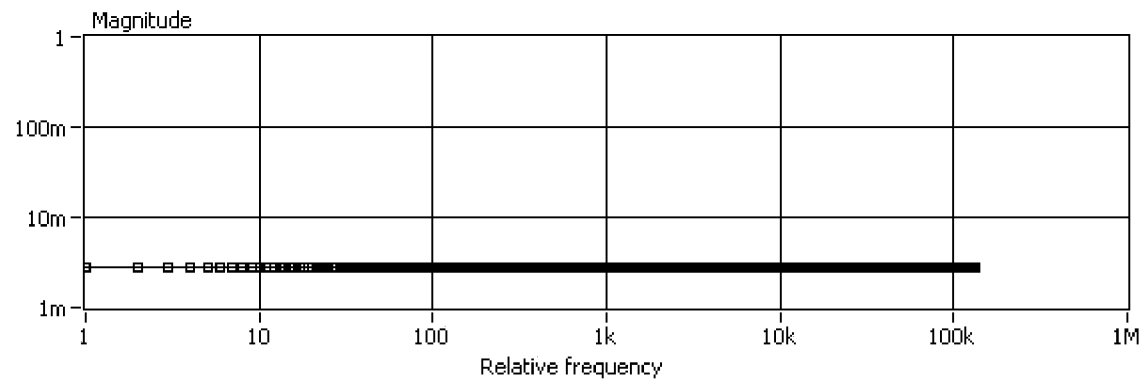
FIG. 5b depicts a MLS spectrum (N=18, p=$2^N$−1=262143).
Figure 10A:
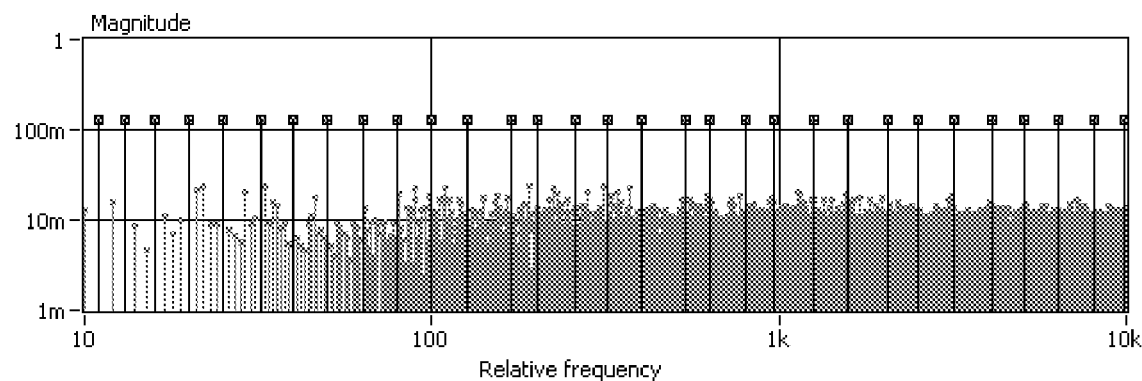
FIG. 10a depicts the waveform spectrum with a first frequency set.
Figure 10B:
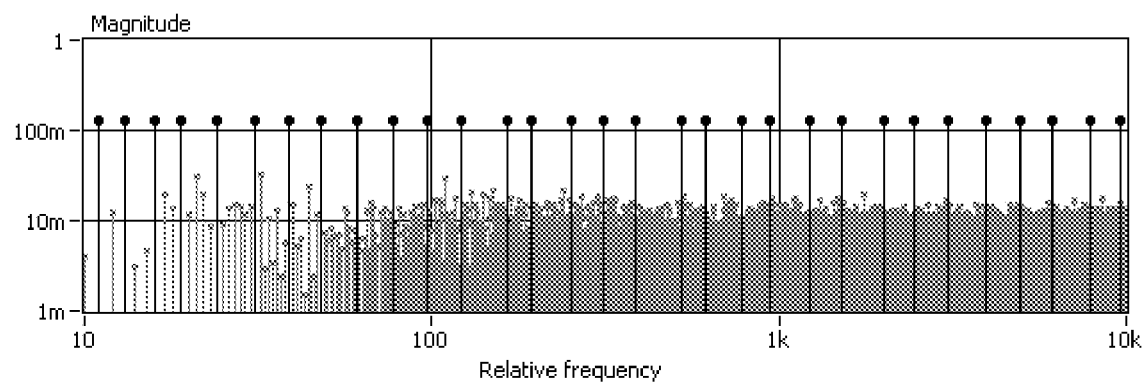
FIG. 10b depicts the waveform spectrum with a second frequency set.
Figure 10C:
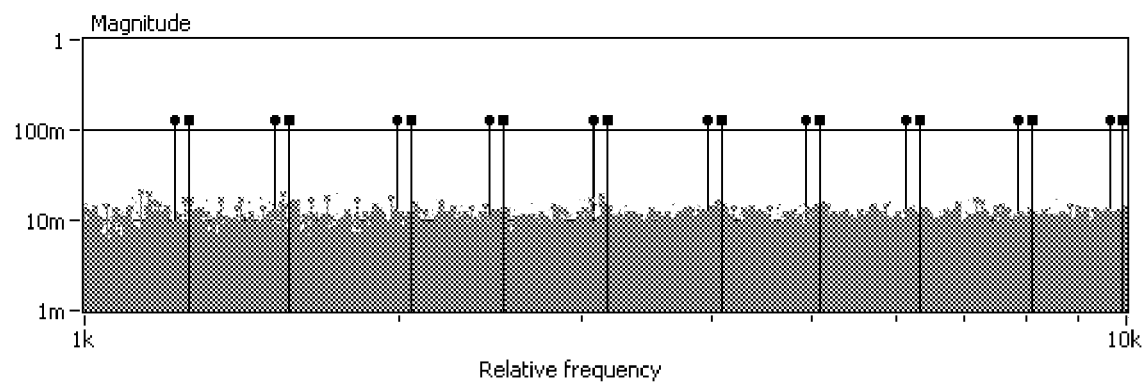
FIG. 10c illustrates the differences of the frequency sets (squared lines: first frequency set; dotted lines: second frequency set; last decade (1 kHz to 10 kHz) shown).

In comparison with the MLS signal, where the length of the sequence should be exactly $p=2^N-1$ (in order to obtain complete flatness of the MLS spectrum, see FIG. 5.*b*), the length of the SSS signal can be arbitrary without degrading the properties of the signal (see FIG. 6.*b*, FIG. 8.*a*, FIGS. 10.*a* and *b*). This is due to the flexibility and adaptiveness of the SSS designing rules.

Often in practice, when the relaxation time of the SUT's are shorter than the length of the excitation sequence, the transition processes are finished and the response of the SUT is stabilized, it is convenient to extract the whole transfer function without delay, as the sequence can be fed repeatedly without gaps to the SUT, and sampled data can be analyzed in the fly, without need to synchronize the starting point of the sequence with the data record.

In summary, the method of fast complex transfer function measurement herein described utilizes the properties of SSS to excite the SUT simultaneously with a predetermined set of arbitrary, but usually approximately equal amplitude frequency components and separate their responses at the output. This achieves the reasonable high frequency resolution (about 2 to 10 separate frequencies per one frequency decade).

This measurement method (simultaneous measuring of the excitation and response signals, for example current and voltage in case of impedance measurements) amongst other advantages decreases considerably necessity for calibration or compensation of different non-idealities, consequently enables to simplify its embodiment (hardware, software, periodic calibration, etc.) as an instrument compared to prior art. Additionally, the mutual influence of the excitation source output parameters and the SUT, short and long time drifts, as well as influence of the short time narrowband disturbances are inherently reduced at least one order of magnitude.

Compared to the background art methods, which use MLS, periodic random noise, Gaussian Noise or other "white-spectrum-like" signals, the proposed technique is considerably more accurate and noise resistant, as the excitation signal energy is concentrated only on the frequencies of interest, not spread equally over the frequency bandwidth. This allows to increase the excitation ability of each individual frequency component significantly, while the maximum peak value of the excitation signal remains unchanged. Additionally, this technique takes full advantage of the a priori knowledge of the frequency content of the signal applied to the SUT in order to remove noise and to separate other disturbing signals from the frequencies of interest.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for generating a binary spectrally sparse sequence periodic excitation signal comprising predetermined discrete frequencies with its energy concentrated at said discrete frequencies for continuous high speed broadband measuring and monitoring of a complex transfer function of a Sample Under Test, the method comprising:
   providing a signal parameter set, said signal parameter set comprising a set of frequencies B, a set of amplitudes A, wherein each amplitude of said set of amplitudes A corresponds to one frequency of said set of frequencies B, a signal length p, and a set of initial phase shift PH, wherein each phase shift corresponds to one frequency of said set of frequencies B, said signal quality set additionally comprises an expected amplitude spectrum Aexp for said binary spectrally sparse sequence;
   providing a signal quality set, wherein said signal quality set comprising an accepted inaccuracy level EPS, wherein EPS is accepted differences of amplitudes A of said intermediate binary sequence from said signal parameter set;
   providing a reference signal Rp for determining transition instance Ti between two discrete values;
   iteratively calculating an intermediate binary sequence, said iteratively calculating comprising:
   a) determining an intermediate signal parameter set,
   b) comparing said intermediate parameter set of said intermediate binary sequence with said signal parameter set,
   c) calculating a template signal Tp as a sum of sine waves according to said signal parameter set,
   d) determining the transition instances Ti by comparing said reference signal Rp and said template signal Tp,
   e) compiling said intermediate binary sequence,
   f) calculating an intermediate signal parameter set, comprising an amplitude spectrum As and phase spectrum PHs for said intermediate binary sequence,
   g) comparing said intermediate signal parameter set against said signal parameter set,
   h) determining whether said intermediate binary sequence meets said signal quality set,
   i) calculating a new template signal Tp using said amplitude spectrum As and said phase spectrum PHs, and
   j) modifying said intermediate binary sequence and repeating steps a) to j) if said signal quality set is not met;
   storing said intermediate binary sequence or its descriptive parameters as said binary sparse spectral sequence when the quality criteria defined by said signal quality set are met; and
   converting said binary sparse spectral sequence by a digital to quantity converter into a physical quantity signal and applying said physical quantity signal as an excitation signal to said Sample Under Test, receiving from said Sample Under Test a response signal corresponding to said physical quantity, converting by a quantity to digital converter said response signal to a digital data record and calculating said Complex Transfer Function of said Sample Under Test from said excitation signal and said response signal, wherein said physical quantity selected from a group consisting of electrical current, voltage, a combination of current and voltage, pressure, tension, force, and temperature.

2. A method as in claim 1, wherein the method further comprises generating and storing a plurality of binary spectrally sparse sequences, each having signal parameter sets B with adjacent but sufficiently different frequencies.

3. A method as in claim 1, wherein the frequencies of said binary spectrally sparse sequence are chosen so that intermodulation and aliasing spectrum components do not coincide with said frequencies of the said binary sequence.

4. A method as in claim 1, wherein the excitation quantity is selected from the group consisting of a voltage signal, a current signal and a mixture of voltage and current signals, a pressure, a tension, a force and a temperature.

5. A method as in claim 1, wherein said calculating said complex transfer function is performed by a digital signal processing technique with appropriate software, selected from a group consisting of a PC, a Digital Signal Processor, a Field Programmable Gate Array, an Application Specific Integral Circuit, or as a specially designed integrated circuit, comprising of energetically and computationally efficient data processing elements like summation, accumulation, and bitwise shift.

6. A method as in claim 5, wherein said data record is split into at least two time slices, a first time slice being processed directly, and all subsequent time slices being processed after decimation prior the processing.

7. A method as in claim 1, wherein at least one of said response signal and said excitation signal is quantized.

8. A method as in claim 7, wherein said transfer function is obtained from said quantized response data and from pre-calculated or pre-tabulated excitation data.

9. A method as in claim 1, wherein said transfer function is obtained directly by the means of discrete Fourier Transform technique or reduced discrete Fourier Transform technique.

10. A method as in claim 1, wherein said transfer function is obtained indirectly via the Impulse Response calculation and the following discrete Fourier Transform technique.

11. A method as in claim 1, comprising two or more excitation channels with orthogonal sequences comprising slightly different frequency spectra for frequency based path separation and at least two receiving channels for analyzing the response signals from at least two sources.

12. A device for analysis of systems and substances, the device comprising a generator adapted for generating a binary signal spectrally sparse sequence by the method as described in claim 1, a waveform memory for storing said spectrally sparse sequence, a digital to quantity converter for converting said sequence to a physical quantity for exciting a sample under test SUT, means for applying said physical quantity to the SUT, a response signal conditioner, an quantity to digital converter to quantize said response signal, a data processing unit, and a transfer function extraction unit adapted to obtain a complex transfer function of the SUT.

13. A device as in claim 12, the device comprising two or more excitation channels with orthogonal sequences, exciting the SUT, the means to apply said physical quantity to the SUT, two or more response signal conditioners, two or more quantity to digital converters or equivalent to quantize said response signals, two or more data processing units or equivalent to process said data, and two or more transfer function extraction units to obtain a complex transfer function of the SUT, said device thereby being suitable for multi-path analysis of systems and substances.

14. A device according to claim 13 in which at least one of said sequence sources, response signal conditioners, quantity to digital converters, data processing units, and transfer function extractors are integrated into an integrated circuit.

15. A method as in claim 1, wherein said Complex Transfer Function of said Sample Under Test is an impedance of said Sample Under Test and said Sample Under Test is an electric device, electric network, a liquid, a biological tissue, a biological organ or entity.

16. A method for generating a binary spectrally sparse sequence periodic excitation signal comprising predetermined discrete frequencies with its energy concentrated at said discrete frequencies for continuous high speed broadband measuring and monitoring of a complex transfer function of a Sample Under Test, the method comprising:
providing a signal parameter set, said signal parameter set comprising a set of frequencies B, a set of amplitudes A, wherein each amplitude of said set of amplitudes A corresponds to one frequency of said set of frequencies B
providing a signal quality set, wherein said signal quality set comprising an accepted inaccuracy level EPS, wherein EPS is accepted differences of amplitudes A of said intermediate binary sequence from said signal parameter set;
providing an initial binary sequence characterized by total number of signal transitions tr and a maximum signal slice length with no transitions ltr,
iteratively calculating an intermediate binary sequence, said iteratively calculating comprising:
  a) determining an intermediate signal parameter set,
  b) comparing said intermediate parameter set of said intermediate binary sequence with said signal parameter set,
  c) determining whether said intermediate binary sequence meets said signal quality set,
  d) modifying said intermediate binary sequence by rearranging the signal transitions Ti if said signal quality set is not met;
storing said intermediate binary sequence or its descriptive parameters as said binary sparse spectral sequence when the quality criteria defined by said signal quality set are met; and
converting said binary sparse spectral sequence by a digital to quantity converter into a physical quantity signal and applying said physical quantity signal as an excitation signal to said Sample Under Test, receiving from said Sample Under Test a response signal corresponding to said physical quantity, converting by a quantity to digital converter said response signal to a digital data record and calculating said Complex Transfer Function of said Sample Under Test from said excitation signal and said response signal, wherein said physical quantity selected from a group consisting of electrical current, voltage, a combination of current and voltage, pressure, tension, force, and temperature.

* * * * *